United States Patent
Wang et al.

(10) Patent No.: US 8,694,857 B2
(45) Date of Patent: Apr. 8, 2014

(54) SYSTEMS AND METHODS FOR ERROR DETECTION AND CORRECTION IN A MEMORY MODULE WHICH INCLUDES A MEMORY BUFFER

(75) Inventors: David Wang, Thousand Oaks, CA (US); Christopher Haywood, Thousand Oaks, CA (US)

(73) Assignee: Inphi Corporation, Westlake Village, CA (US)

( * ) Notice: Subject to any disclaimer, the term of this patent is extended or adjusted under 35 U.S.C. 154(b) by 160 days.

(21) Appl. No.: 13/445,143

(22) Filed: Apr. 12, 2012

(65) Prior Publication Data

US 2012/0266041 A1    Oct. 18, 2012

Related U.S. Application Data

(60) Provisional application No. 61/475,184, filed on Apr. 13, 2011.

(51) Int. Cl.
*G11C 29/00* (2006.01)

(52) U.S. Cl.
USPC .......................................................... 714/763

(58) Field of Classification Search
None
See application file for complete search history.

(56) References Cited

U.S. PATENT DOCUMENTS

| | | | |
|---|---|---|---|
| 6,832,340 B2 * | 12/2004 | Larson et al. | 714/42 |
| 7,334,159 B1 * | 2/2008 | Callaghan | 714/30 |
| 7,477,522 B2 * | 1/2009 | Hazelzet | 361/760 |
| 7,644,216 B2 * | 1/2010 | Fahr et al. | 710/301 |
| 7,870,459 B2 * | 1/2011 | Hazelzet | 714/753 |
| 7,949,931 B2 * | 5/2011 | Lastras-Montano | 714/785 |
| 8,239,724 B2 * | 8/2012 | Swing et al. | 714/752 |
| 8,381,064 B2 * | 2/2013 | Hazelzet | 714/753 |
| 2006/0126408 A1 * | 6/2006 | Bucksch | 365/200 |
| 2006/0193184 A1 * | 8/2006 | Poechmueller | 365/200 |
| 2007/0079217 A1 * | 4/2007 | Haugan et al. | 714/763 |
| 2008/0094811 A1 * | 4/2008 | Hazelzet | 361/760 |
| 2008/0098277 A1 * | 4/2008 | Hazelzet | 714/753 |
| 2008/0256281 A1 * | 10/2008 | Fahr et al. | 710/305 |
| 2008/0276032 A1 * | 11/2008 | Iida et al. | 710/316 |
| 2009/0244949 A1 * | 10/2009 | Ravasio et al. | 365/63 |
| 2010/0005220 A1 * | 1/2010 | Loughner et al. | 711/5 |
| 2010/0162037 A1 * | 6/2010 | Maule et al. | 714/5 |
| 2010/0235605 A1 * | 9/2010 | Perry et al. | 711/170 |
| 2010/0269012 A1 * | 10/2010 | Hazelzet | 714/753 |
| 2012/0268982 A1 * | 10/2012 | Rajan | 365/149 |

* cited by examiner

*Primary Examiner* — Guerrier Merant
(74) *Attorney, Agent, or Firm* — Koppel, Patrick, Heybl & Philpott

(57) ABSTRACT

The present systems include a memory module containing a plurality of RAM chips, typically DRAM, and a memory buffer arranged to buffer data between the DRAM and a host controller. The memory buffer includes an error detection and correction circuit arranged to ensure the integrity of the stored data words. One way in which this may be accomplished is by computing parity bits for each data word and storing them in parallel with each data word. The error detection and correction circuit can be arranged to detect and correct single errors, or multi-errors if the host controller includes its own error detection and correction circuit. Alternatively, the locations of faulty storage cells can be determined and stored in an address match table, which is then used to control multiplexers that direct data around the faulty cells, to redundant DRAM chips in one embodiment or to embedded SRAM in another.

12 Claims, 6 Drawing Sheets

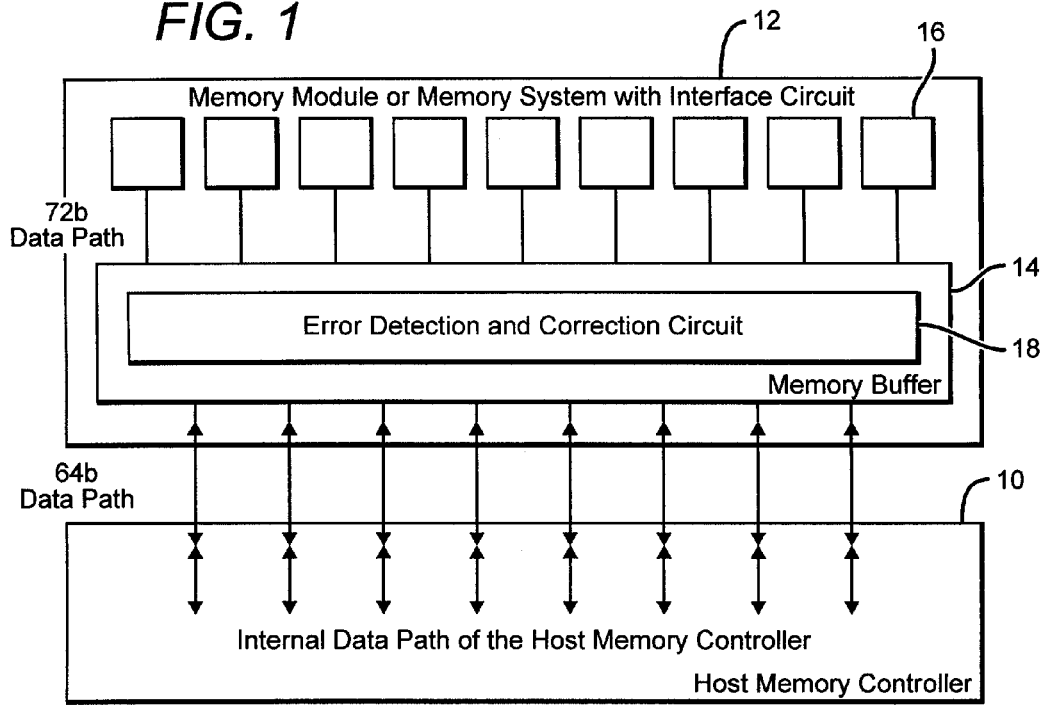
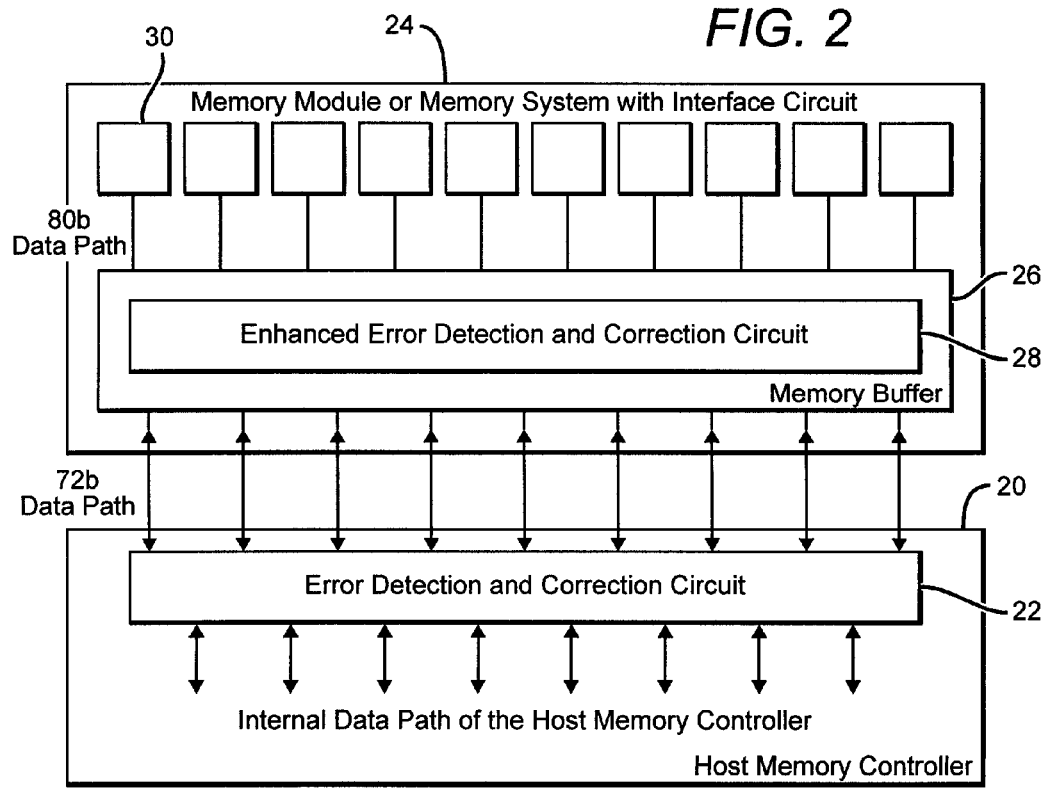

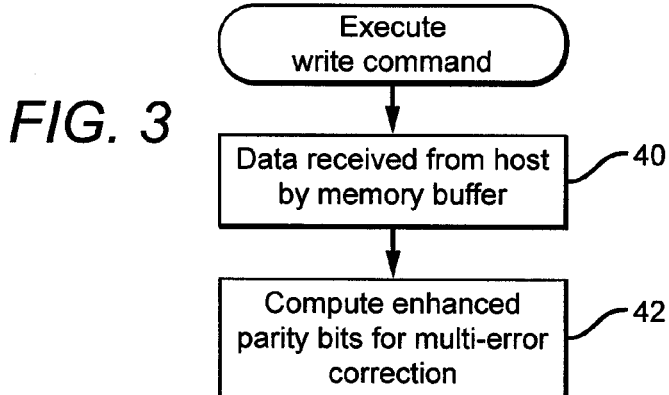
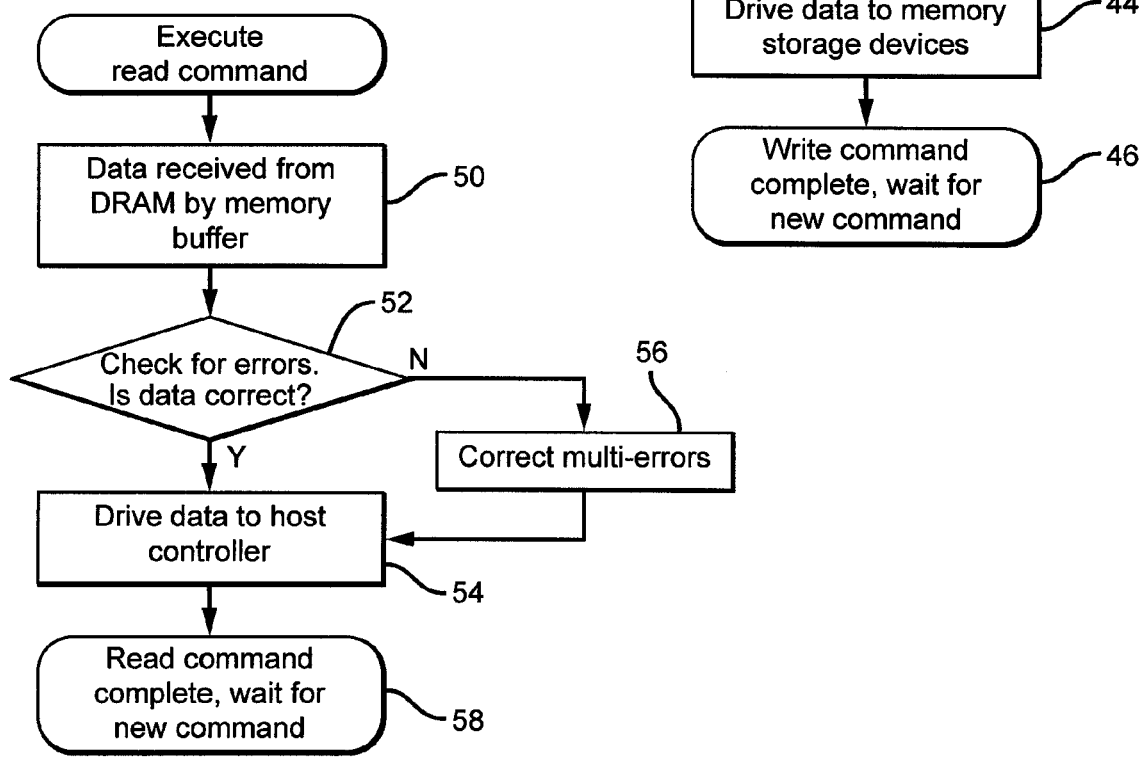

| Rank ID | Bank ID | Row Address | Column Address | Steer ID |
|---|---|---|---|---|
| 0 | 3 | 0x0A81 | 0x00C1 | 2 |
| 0 | 3 | 0x1BC1 | 0x01E0 | 3 |
| 1 | 0 | 0x0C03 | 0x032D | 4 |
| 1 | 1 | 0x0047 | 0x0004 | 2 |
| 1 | 1 | 0x0161 | 0x00CC | 7 |
| 1 | 2 | 0x1958 | 0x006E | 1 |
| 1 | 2 | 0x04DA | 0x01E9 | 2 |
| 1 | 3 | 0x098C | 0x000E | 4 |

SYSTEMS AND METHODS FOR ERROR DETECTION AND CORRECTION IN A MEMORY MODULE WHICH INCLUDES A MEMORY BUFFER

RELATED APPLICATIONS

This application claims the benefit of provisional patent application No. 61/475,184 to Wang et al., filed Apr. 13, 2011.

BACKGROUND OF THE INVENTION

1. Field of the Invention

This invention relates generally to error detection and correction techniques for use with a memory module which includes a memory buffer that serves as an interface between a host controller and the RAM chips residing on the module.

2. Description of the Related Art

Data stored in memory storage devices may be subjected to electronic, electromagnetic or other forms of interference that can corrupt or change the stored value. Consequently, memory systems designed for reliable operation have been constructed with error detection and correction capabilities to detect and correct for errors that occur in the storage devices. However, these capabilities typically require a considerable amount of overhead, in terms of access latency and the calculation and storage of parity bits, for example. In such memory systems, when memory is accessed, the stored parity bits are returned along with the data; the host memory controller then uses the parity bits to detect and correct errors in the retrieved data.

Host memory controllers designed to support error correction for low latency applications typically limit the error correction capability to the detection and correction of a "single error", and the detection of two or more errors within a data word. A "single error" may be in the form of a single bit, or in certain cases, the failure of a single memory device that results in the failure of multiple bits in adjacent locations within a data word. Host controllers of this sort typically do not support the correction of "multi-errors"—i.e., errors in the form of multiple bits or the failure of multiple memory devices—assuming that the memory storage devices are highly reliable and that storage errors occur only as a result of low probability interference that corrupts the values stored in the memory device.

One trend in the development of memory storage devices is that as the storage cells continue to shrink due to advancements in process technology, the storage cells may be more susceptible to interference that corrupts the stored values. Consequently, multi-errors within a single data word may occur with higher degrees of probability in future memory systems. However, conventional methods of correcting such errors typically require significant changes to the host controller and the system infrastructure, and negatively impact the storage overhead and access latency characteristics of the memory system.

Contemporary memory storage devices such as SDRAM, DDR SDRAM, DDR2 SDRAM, and DDR3 SDRAM devices are often organized and used in existing computing systems as main memory. Computing systems that utilize these memory storage devices as main memory may be broadly classified into three categories according to their error detection and correction requirements:

Systems that do not detect or correct for data errors.
Systems that detect and correct for single errors and detect but do not correct multi-errors.
Systems that detect and correct multi-errors.

In general, systems that detect and correct for multi-errors have high reliability requirements, and can tolerate the longer access latencies associated with encoding and storing the parity bits required for multi-error detection and correction algorithms. Systems that implement multi-error detection and correction are better able to handle errors that result from memory storage devices that have a higher probability of returning erroneous data.

SUMMARY OF THE INVENTION

The present invention is directed to systems and methods for error detection and correction in a memory module which includes a memory buffer, which can enable computing systems without multi-error correction capability to utilize memory storage devices that are more susceptible to errors, without compromising the integrity requirements of the computing systems.

A memory module in accordance with the present invention includes a plurality of RAM chips, typically DRAM, and a memory buffer arranged to buffer data and/or command bytes being written to or read from the plurality of RAM chips by a host controller. The memory buffer further comprises an error detection and correction circuit arranged to ensure the integrity of the data words stored in the plurality of RAM chips. One method by which data integrity can be ensured is by arranging the error detection and correction circuit to compute one or more parity bits for each data word written to and read from the RAM chips; the computed parity bits may be stored in parallel with each data word.

The memory buffer's error detection and correction circuit can be arranged to detect and correct at least single errors in data words read from the RAM chips. The present memory module can be used with host controllers which do not include their own integrated error detection and correction circuit, or with host controllers which do include an integrated error detection and correction circuit. Such integrated error detection and correction circuits are typically designed to correct single errors detected in data words read from the memory module; when so arranged, the error detection and correction circuit within the memory buffer can be arranged to detect and correct multi-errors in data words read from said RAM chips.

Various other error detection and correction techniques are also described. For example, for a system in which the host controller includes an integrated error detection and correction circuit designed to correct single errors detected in data words read from the memory module, the memory module and host controller may be arranged such that when a data word is read from the RAM chips, it bypasses the error detection and correction circuit within the memory buffer and conveys it to the host controller, which checks it for errors. If a single error is detected, it can be corrected with the integrated error detection and correction circuit. However, if a multi-error is detected, the host controller can issue a multi-error recovery command and a read command, so that the data word is conveyed from the RAM chips to the error detection and correction circuit within the memory buffer, which corrects the multi-error. Other techniques which are described include data steering methods, in which the locations of faulty storage cells are determined and stored in an address match table, which is used to control multiplexers so as to direct data around the faulty cells, to redundant RAM chips in one embodiment, and to SRAM embedded within the memory buffer in another embodiment.

The present systems and methods are applicable when the memory module comprises, for example, a DIMM in compliance with the load-reduced DIMM (LRDIMM), registered DIMM (RDIMM), unregistered DIMM (UDIMM), non-volatile DIMM (NV-DIMM) or any DDR interface standard specifications.

These and other features, aspects, and advantages of the present invention will become better understood with reference to the following description and claims.

BRIEF DESCRIPTION OF THE DRAWINGS

FIG. 1 is a block diagram of a memory module which includes a memory buffer having an error detection and correction circuit and a host controller with no error correction means.

FIG. 2 is a block diagram of a memory module which includes a memory buffer having an error detection and correction circuit and a host controller which includes an integrated error detection and correction circuit.

FIG. 3 is a flow diagram illustrating a 'write' command for a memory module as shown in FIG. 1.

FIG. 4 is a flow diagram illustrating a 'read' command for a memory module as shown in FIG. 1.

FIG. 7 is an address match table as might be used in a memory buffer as shown in FIG. 6.

DETAILED DESCRIPTION OF THE INVENTION

Figure 5:
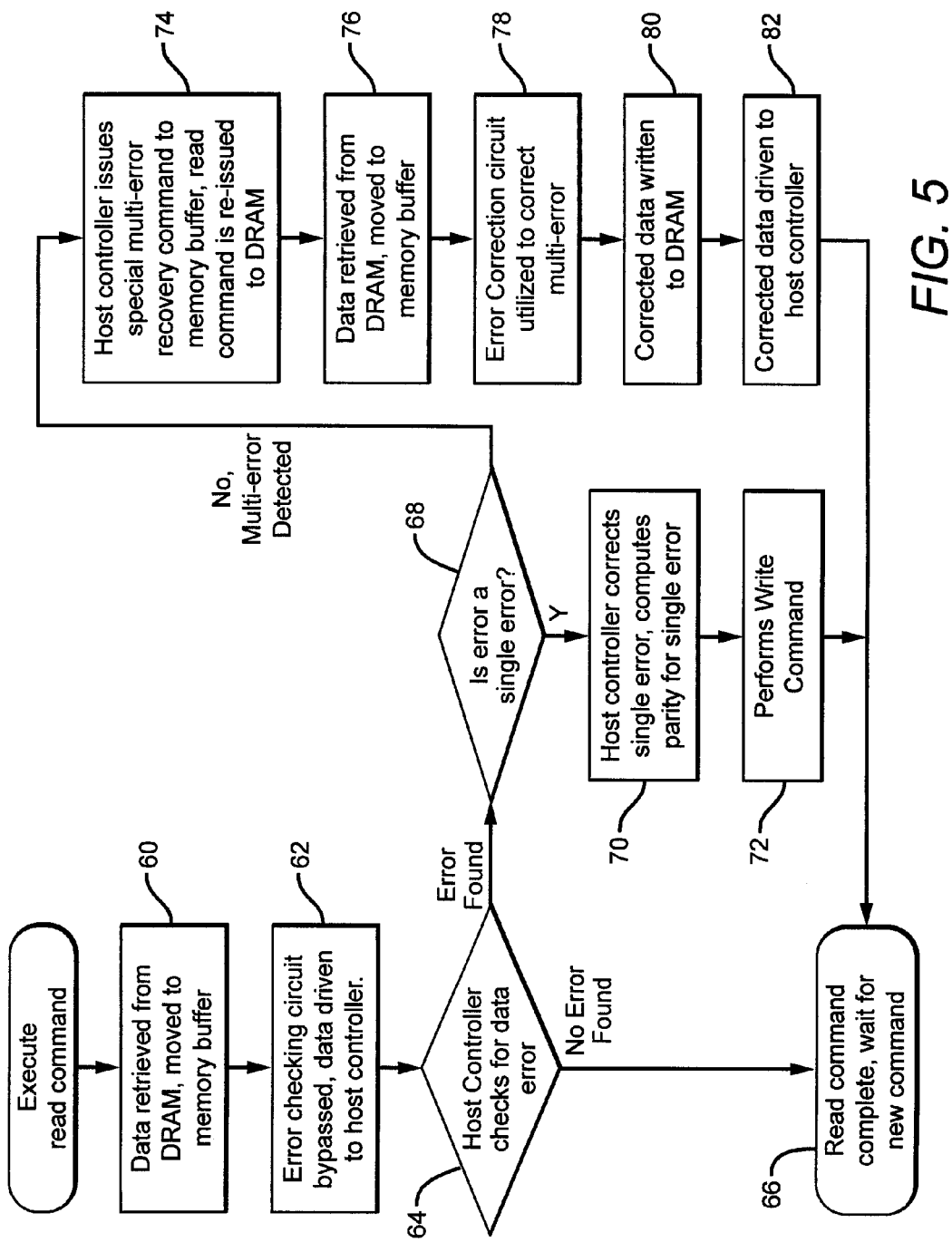
FIG. 5 is a flow diagram illustrating a 'read' command for a memory module as shown in FIG. 2.

The present systems and methods are designed to improve memory system reliability for memory systems that do not detect or correct for data errors, as well as for systems that detect and correct for single errors and detect but do not correct multi-errors. The improvements in error correction capability enable computing systems without multi-error correction capability to utilize memory storage devices that are more susceptible to errors, without compromising the integrity requirements of the computing systems.

The systems and methods may be implemented in different ways for different systems. Multiple implementations are described herein as illustrative examples; the examples should not be construed as limiting the present invention in nature. Common to all systems to which the present system is applicable is a host controller which is coupled to an interface device that acts as an interface between the host controller and a plurality of RAM chips, and which includes an error detection and correction capability. The interface device may be, for example, a memory buffer which resides on a memory module such as a DIMM on which the RAM chips also reside; this is the configuration described herein. However, it is not essential that the present system be configured in this way. For example, the system could be implemented with a memory system that employs a form factor other than a DIMM, and the interface device need not necessarily be a memory buffer. That is, the systems and methods described herein are not limited to use with a particular form factor or system topology, and can be adapted to cover future changes in system topology and organization.

As noted above, the configuration used as an example throughout the description is a host controller which interfaces with a memory module such as a DIMM, with the memory module including a memory buffer which acts as an interface between the host controller and a plurality of RAM chips. The memory buffer may be, for example, a device such as the iMB (isolating Memory Buffer) from Inphi Corporation. Memory buffers of this sort are described, for example, in co-pending U.S. patent application Nos. 12/267,355 and 12/563,308.

Conventional memory systems can have various levels of error detection and correction capability. For example, a memory system can be organized without any error detection or correction capability. Here, no parity or error correction bits are calculated for the data words being stored, and no memory storage devices are dedicated to the storage of parity data.

Another known approach is to have a memory system arranged such that the host controller contains an integrated error detection and correction circuit that, for example, computes parity for each data word written into memory. In this case, the memory system includes a memory device dedicated to the storage of parity data; the integrated error detection and correction circuit computes parity for each data word written into memory, and stores the parity data along with the data word in the memory devices. In the case of a read command, the memory devices return the stored data word along with the stored parity bits, and the integrated error detection and correction circuit inside of the host controller can then use the parity bits to detect and correct errors. However, this type of system is typically unable to correct multi-errors.

One possible implementation of a memory module which includes a memory buffer in accordance with the present invention is shown in FIG. 1. Here, the host controller 10 does not include any error detection and correction circuitry. The host controller interfaces with a memory module 12, typically a DIMM, which includes a memory buffer 14. One function of memory buffer 14 is to provide an interface between host controller 10 and a plurality of RAM chips 16 (hereinafter referred to as DRAM, though other memory device types might also be used), with the memory buffer arranged to buffer data and/or command bytes being written to or read from the DRAM by the host controller.

In this embodiment, memory buffer 14 includes an error detection and correction circuit 18, which is arranged to ensure the integrity of the data words stored in DRAM 16. One possible way in which this can be accomplished is to have error detection and correction circuit 18 compute parity bits for each data word to be stored in DRAM 16. The computed parity bits can then be stored, for example, in parallel with each data word. This necessitates the use of more DRAM than would be needed for the data alone, and thus the use of a wider data bus than that needed between host controller 10 and memory buffer 14. For example, in the embodiment shown in FIG. 1, the data bus between host controller 10 and memory buffer 14 is 64 bits wide, while the width of the data bus between the memory buffer and DRAM 16 is 72 bits. The parallel storage of parity bits with each data word means that the system does not have to sacrifice address space or memory bandwidth for the purpose of ensuring data integrity.

Another possible implementation of a memory module which includes a memory buffer in accordance with the present invention is shown in FIG. 2. Here, the host controller 20 includes an error detection and correction circuit 22 designed to correct single errors; the host controller interfaces with a memory module 24. To accommodate the functionality of error detection and correction circuit 22, the data bus between host controller 20 and memory module 24 is wider (e.g., 72 bits) than that needed solely for data (e.g., 64 bits)—which enables error detection and correction circuit 22 to compute and store parity bits in parallel with each data word.

While error detection and correction circuit 22 may be able to detect such errors, it is typically unable to correct them. To provide this functionality, memory module 24 includes a memory buffer 26, which also includes an error detection and correction circuit 28 which is preferably arranged to detect and correct multi-errors that may occur. To facilitate this, the data bus between memory buffer 26 and DRAM 30 is preferably wider (e.g., 80 bits) than that between the memory buffer and host controller 20 (e.g., 72 bits). The wider data bus enables error detection and correction circuit 28 to compute and store additional parity bits in DRAM, in parallel with each data word.

The detection and correction of multi-errors in conventional memory systems is a complex process that incurs added latency to memory accesses. This problem can be mitigated with the use of a memory module in accordance with the present invention. A flow chart illustrating the execution of a write command for one possible multi-error correction method is shown in FIG. 3. As a first step (40), data associated with the write command is received from the host controller by the memory buffer. In step 42, the memory buffer's error detection and correction circuit, labeled as 28 in FIG. 2, utilizes advanced error correction algorithms such as (well known) BCH codes or Reed-Solomon Codes to generate the appropriate parity bits to enable the correction of multi-errors. Then, in step 44, the memory buffer drives the data and the computed parity bits to DRAM for storage. The execution of a write command is complete (46) upon the conclusion of the data storage phase.

The execution of a read command for one possible multi-error correction method is shown in FIG. 4. In the first step of the execution of the read command, labeled as 50, the data word and its associated parity bits are received from DRAM by the memory buffer. Then, in step 52, the memory buffer's error detection and correction circuit uses the received parity bits to check for the correctness of the data word. If no errors are detected, the data word is driven to the host controller (54). If one or more errors are detected, the execution of the read command moves to step 56, in which the errors are corrected. The corrected data word is then driven to the host controller (54); the execution of the read command is complete (58) at the conclusion of step 54.

Multi-error correction may be implemented with different algorithms that can be traded off between error correction latency, parity storage overhead and the probability of errors. If long memory access latency is acceptable, high parity storage overhead is not acceptable, and the probability of errors is relatively high, the methods shown in FIGS. 3 and 4 would be the preferred method to automatically detect and correct multi-errors present in a data word. However, if low latency is required and the probability of errors are low, then the method illustrated in FIG. 5 (which depicts the steps of a read command) may be preferred, as the FIG. 5 method shifts the burden of error detection to the host memory controller, which can detect but not correct for multi-errors. In such a case, the memory buffer's error detection and correction circuit is bypassed for typical accesses. But if a multi-error is detected by the host controller, the memory buffer's error detection and correction circuit is engaged using a special multi-error recovery process.

In the first phase of the execution of the read command, labeled as 60 in FIG. 5, data is moved from DRAM into the memory buffer, just as in step 50 in FIG. 4. However, in the next step of the execution of the read command, labeled as 62, the data is assumed to be correct, the memory buffer's error detection and correction circuit is bypassed, and the data word is driven directly to the host controller. In step 64, the host controller checks for the presence of errors. If no errors are found, the read command is complete (66). In the case that a single error or multi-errors are discovered, the execution of the read command moves to step 68, which determines whether the error is a single error or a multi-error. If a single error, the host controller simply corrects the error and re-computes the parity (70). Then a write-back to DRAM as outlined in FIG. 3 is performed in step 72, and the read command is complete.

Alternatively, if step 68 determines the error to be a multi-error which is uncorrectable by the host controller, execution of the read command then progresses to a special multi-error recovery sequence. In step 74, the host controller initiates the special multi-error recovery sequence by issuing a special multi-error recovery command to the memory buffer, concurrent with a read command issued to DRAM. Data is then moved from DRAM into the memory buffer in step 76 just as it was in step 60. However, rather than bypass the memory buffer's error detection and correction circuit, the memory buffer's error detection and correction circuit—which should be arranged to correct for multi-errors—is utilized to correct the multi-error in the data word (78). The corrected data and parity is then stored into DRAM (step 80) and driven back to the host controller (step 82). The read command would typically be complete at this point, though the method might alternatively be arranged to have the host controller again check for the presence of errors (not shown).

In modern memory systems, there are low latency memories that have effectively infinite endurance or usage-cycles and do not degrade due to age or repeated accesses, and relatively longer latency memories that do not have infinite endurance or usage cycles, but which may degrade with respect to age or repeated accesses. In the case of the relatively long latency memories, sophisticated multi-error detection and correction algorithms have been implemented to correct for data cells that may degrade over the lifetime of the device due to aging effects or repeated accesses. In contrast, in the case of low latency memories such as DRAM devices, effectively infinite endurance or usage-cycles are assumed—so that once weak or bad bits are mapped out by the device manufacturer, no errors should occur due to degradation of data cells due to aging effects or repeated accesses.

One trend in the development of memory storage devices is that as the storage cells continue to shrink due to advancements in process technology, storage cells in low latency memories such as DRAM may become more susceptible to errors that occur due to aging effects or repeated accesses. Discussed below are several possible systems and methods which, rather than correct bad data with an error detection and correction circuit as discussed above, instead replace the faulty storage cells with additional storage devices and direct the flow of data around the faulty cells.

Figure 6:
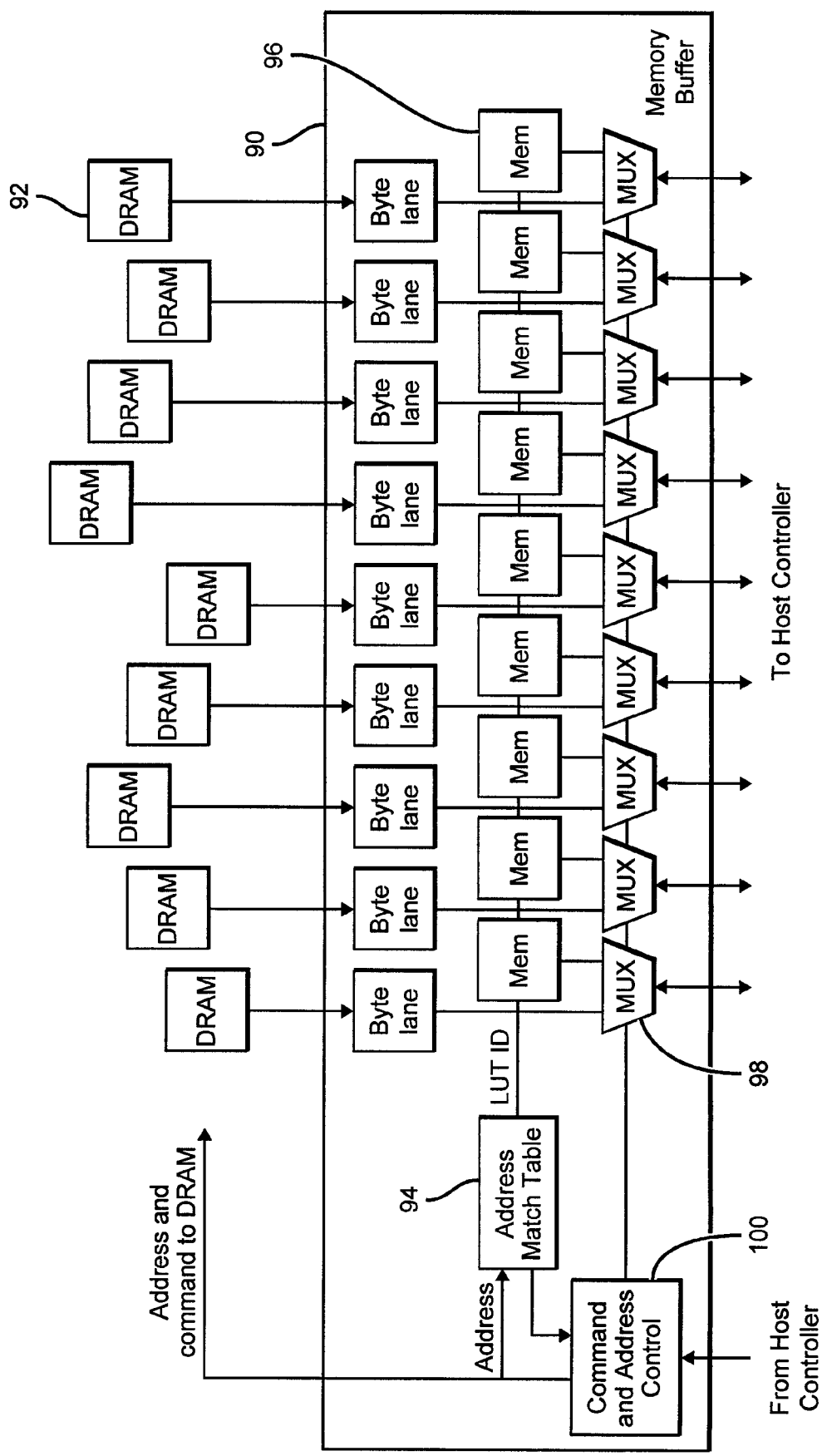
FIG. 6 is a block diagram of a memory buffer having an error detection and correction circuit which includes additional embedded memory storage devices and multiplexers arranged to direct the flow of data around faulty storage cells.

In one possible embodiment, shown in FIG. 6, the additional storage devices are embedded within the memory buffer and used to replace faulty storage cells in the DRAM. In this exemplary embodiment, memory buffer 90 serves as an interface between a host controller (not shown) and DRAM 92. The memory buffer includes an address match table 94, which stores the addresses of faulty storage cells among the cells of DRAM 92; these addresses are determined using testing methods which are outside the scope of this discussion but which are well-known to those familiar with memory devices.

Memory buffer 90 also contains embedded memory storage devices 96 which are distinct from DRAM 92, and a plurality of bi-directional multiplexers 98 which convey data words from the host controller and the memory storage devices 96 within the memory buffer or DRAM 92 when a write operation is performed, and from memory storage devices 96 or DRAM 92 and the host controller when a read operation is performed. Embedded memory storage devices 96 are suitably SRAM devices.

Address match table 94 is arranged to receive addresses for read and write operations as generated by the host controller, compare each received address to the addresses stored in the address match table, and control multiplexers 98 such that one or more bits of a data word are written to and read from memory storage devices 96 within memory buffer 90 when the address associated with the data word matches that of a faulty storage cell, such that the flow of data is directed around the faulty storage cell.

Memory buffer 90 would typically also include a command and address control circuit 100. When command and address control circuit 100 receives a read or write command, it sends the associated address to address match table 94 (and to DRAM 92). One possible arrangement of address match table 94 is shown in FIG. 7. If the address matches an entry in the address match table, the appropriate multiplexers 98 are engaged (via, e.g., command and address control circuit 100 as shown in FIG. 6) to direct the flow of data into (for a write command) and out of (for a read command) the embedded memory device indicated by the SRAM ID column of the address match table.

Figures 8, 10:
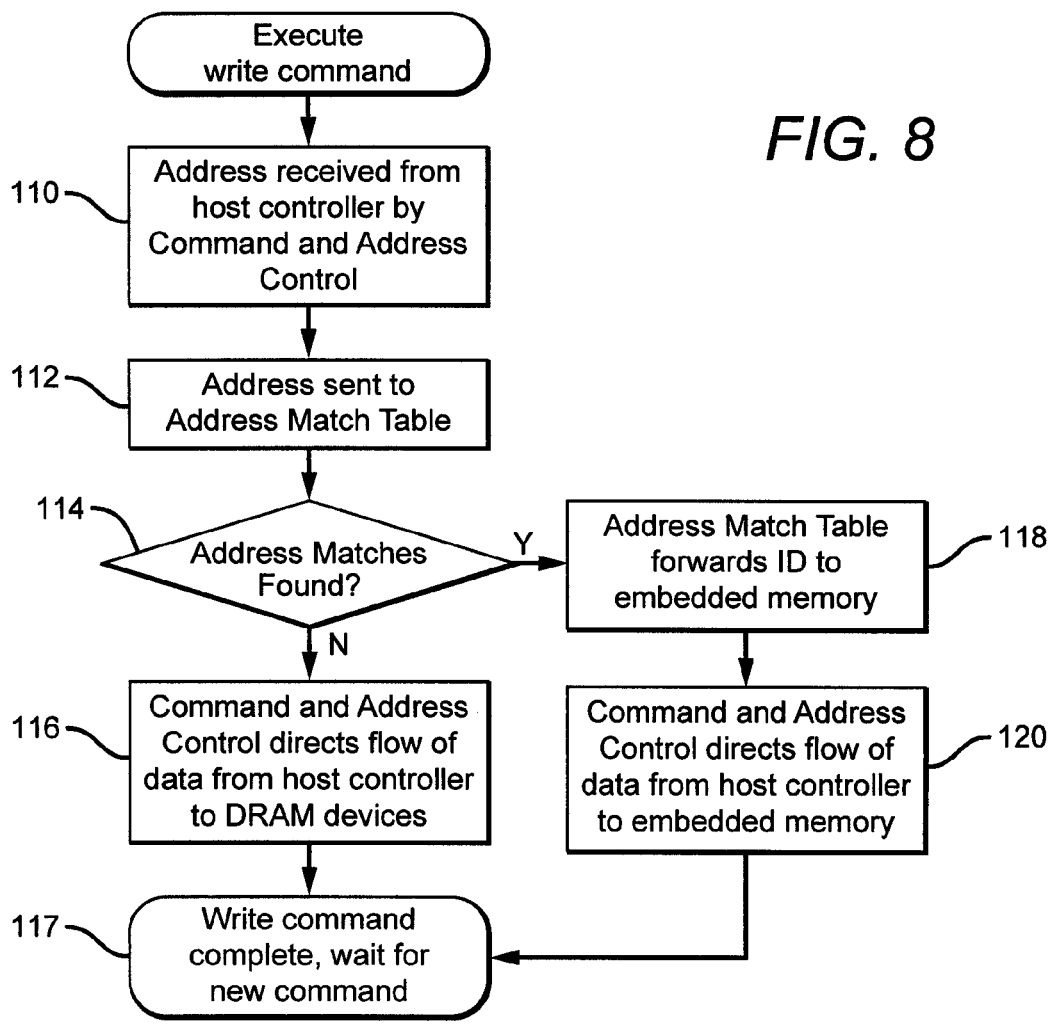
FIG. 8 is a flow diagram illustrating a 'write' command for a memory buffer as shown in FIG. 6.
FIG. 10 is an address match table as might be used in a memory buffer as shown in FIG. 9.

FIG. 8 shows an example flow chart for the execution of a write command for a memory system as shown in FIG. 6. In the first step (110) the address and command are received by command and address control circuit 100 inside of memory buffer 90. The address is then sent to address match table 94 in step 112. In step 114, the address match table determines whether the received address matches one of the addresses on its list of faulty cells. If not, the execution of the write command progresses normally, with command and address control circuit 100 directing the flow of data to DRAM 92, as described in step 116; this completes the write command (step 117). If an address match is found, the address match table forwards an ID to embedded memory 96 (step 118), and data from the host controller is directed to the embedded memory (step 120) to complete the write command (117).

Figure 9:
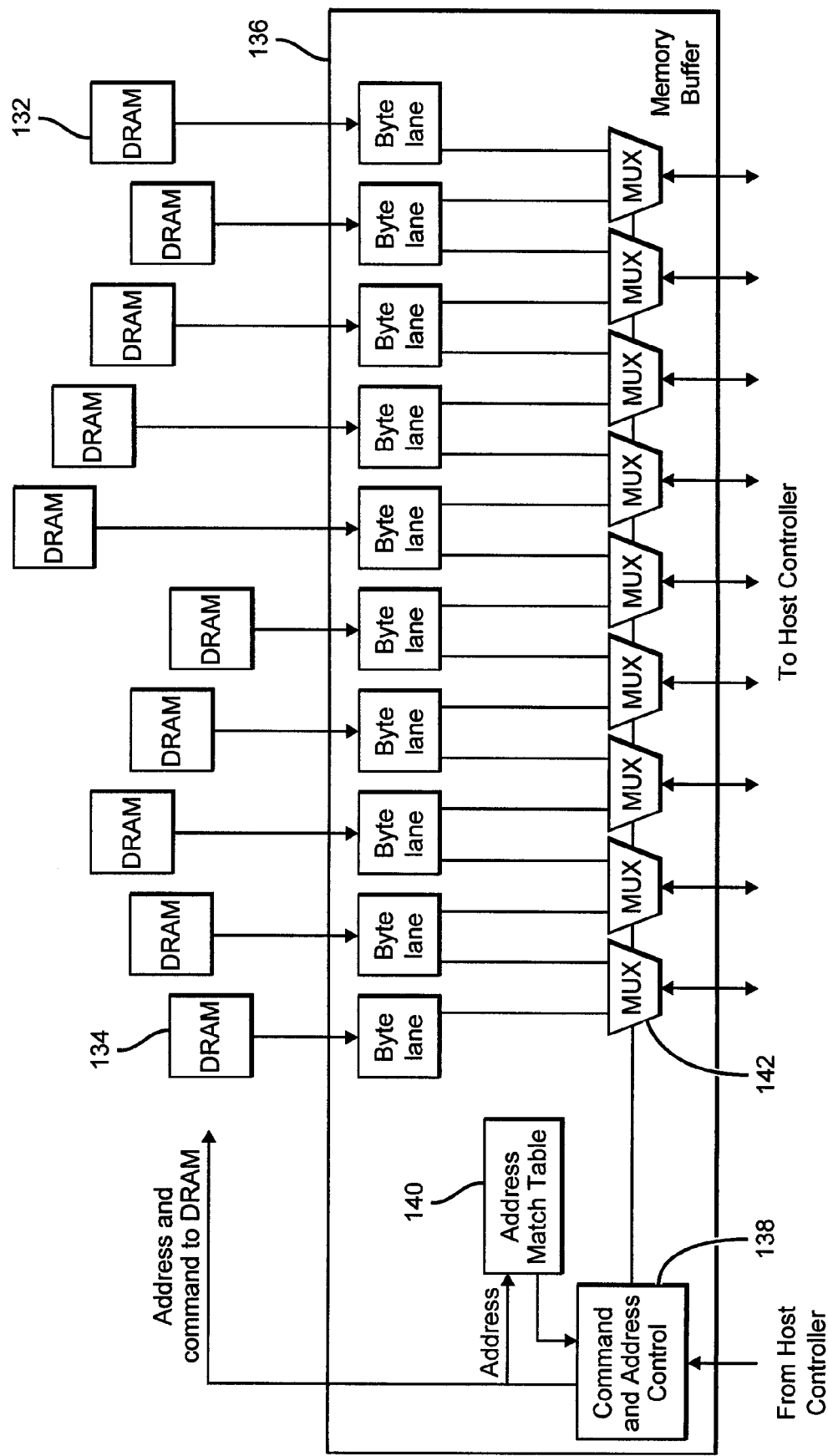
FIG. 9 is a block diagram of a memory buffer having an error detection and correction circuit which includes multiplexers coupled to redundant memory storage devices and arranged to direct the flow of data around faulty storage cells.

In another possible embodiment, shown in FIG. 9, redundant RAM chips 132 (typically DRAM) are used to replace faulty storage cells in the DRAM 134. As in FIG. 6, memory buffer 136 includes a command and address control circuit 138, an address match table 140 which stores the addresses of faulty storage cells within DRAM 134, and a plurality of bi-directional multiplexers 142 which convey data words from the host controller and the redundant RAM chips 132 or the DRAM 134 when a write operation is performed, and from the redundant RAM chips or the DRAM and the host controller when a read operation is performed. Address match table 140 is arranged to receive addresses for read and write operations as generated by the host controller, compare each received address to the addresses stored in the address match table, and control multiplexers 142 such that one or more bits of a data word are written to and read from redundant RAM chips 132 when the address associated with the data word matches that of a faulty storage cell, such that the flow of data is directed around the faulty storage cell.

In operation, if command and address control circuit 138 receives a read or write command, it sends the associated address to address match table 140 (and to DRAM 134). One possible arrangement of address match table 140 is shown in FIG. 10. If the address matches an entry in the address match table, the appropriate multiplexers 142 are engaged (via, e.g., command and address control circuit 138 as shown in FIG. 9) to direct the flow of data around the DRAM device indicated by the Steer ID column of the address match table, where each Steer ID entry represents a DRAM device containing a faulty storage cell.

One possible alternative usage of an address match table is that, instead of containing specific addresses, the address match table is modified to support address ranges—where each address range is associated with a particular Steer ID. Then, when addresses generated by the host controller are determined to be within the address range of one of the DRAM devices with a faulty storage cell, the multiplexers are caused to direct the flow of data around the faulty storage cell.

FIG. 9 illustrates an implementation in which a single memory buffer (136) encompasses all of the critical circuits. One possible alternate implementation would place command and address control circuit 138 and address match table 140 into a single Command and Address Control component, while the multiplexers 142 might be contained in separate data buffer components.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A memory module, comprising:
a plurality of RAM chips; and
a memory buffer arranged to buffer data and/or command bytes being written to or read from said plurality of RAM chips by a host controller, said memory buffer further comprising an error detection and correction circuit arranged to ensure the integrity of the data words stored in said plurality of RAM chips;
wherein said host controller includes an integrated error detection and correction circuit designed to correct single errors detected in data words read from said memory module, said error detection and correction circuit within said memory module arranged to detect and correct multi-errors in data words read from said RAM chips.

2. The memory module of claim 1, wherein said RAM chips comprise DRAM chips.

3. The memory module of claim 1, wherein said memory module comprises a DIMM in compliance with the load-reduced DIMM (LRDIMM), registered DIMM (RDIMM), unregistered DIMM (UDIMM), non-volatile DIMM (NV-DIMM) or any DDR interface standard specifications.

4. The memory module of claim 1, wherein said error detection and correction circuit is arranged to compute one or more parity bits for each data word written to and read from said RAM chips.

5. The memory module of claim 4, wherein said computed parity bits are stored in parallel with each data word.

6. The memory module of claim 4, wherein said error detection and correction circuit is arranged to detect and correct at least single errors in data words read from said RAM chips.

7. The memory module of claim 1, wherein said host controller does not include an integrated error detection and correction circuit.

8. A memory module, comprising:
a plurality of RAM chips; and
a memory buffer arranged to buffer data and/or command bytes being written to or read from said plurality of RAM chips by a host controller, said memory buffer further comprising an error detection and correction circuit arranged to ensure the integrity of the data words stored in said plurality of RAM chips;
wherein said host controller includes an integrated error detection and correction circuit designed to correct single errors detected in data words read from said RAM chips, said memory module and host controller arranged to:
when a data word is read from said RAM chips, bypass said error detection and correction circuit within said memory module and convey said data word to said host controller;
check for errors within said data word conveyed to said host controller with said integrated error detection and correction circuit;
if a single error is detected by said integrated error detection and correction circuit:
correct said error with said integrated error detection and correction circuit;
re-compute the parity bits for said data word; and
write said corrected data word back to said RAM chips;
if a multi-error is detected integrated error detection and correction circuit:
issue a multi-error recovery command and a read command from said host controller to said memory module;
convey said data word from said RAM chips to said error detection and correction circuit within said memory module;
correct said multi-error with said error detection and correction circuit within said memory module;
re-compute the parity bits for said data word; and
write said corrected data word back to said RAM chips.

9. The memory module of claim 1, wherein said error detection and correction circuit comprises:
an address match table which stores the addresses of faulty storage cells within said RAM chips;
memory storage devices embedded within said memory buffer and distinct from said RAM chips;
a plurality of bi-directional multiplexers which convey data words from said host controller and said embedded memory storage devices or said RAM chips when a write operation is performed, and from said embedded memory storage devices or said RAM chips and said host controller when a read operation is performed;
said address match table arranged to:
receive addresses for read and write operations as generated by said host controller;
compare each received address to the addresses stored in said address match table; and
control said multiplexers such that one or more bits of a data word are written to and read from said embedded memory storage devices when the address associated with said data word matches that of a faulty storage cell, such that the flow of data is directed around said faulty storage cell.

10. The memory module of claim 9, further comprising a command and address control circuit arranged to receive command and address data from said host controller, to convey said address data to said address match table, and to convey said command and address data to said RAM chips.

11. The memory module of claim 1, further comprising:
at least one redundant RAM chip distinct from said RAM chips;
wherein said error detection and correction circuit comprises:
an address match table which stores the addresses of faulty storage cells within said RAM chips; and
a plurality of bi-directional multiplexers which convey data words from said host controller and said redundant RAM chips or said RAM chips when a write operation is performed, and from said redundant RAM chips or said RAM chips and said host controller when a read operation is performed;
said address match table arranged to:
receive addresses for read and write operations as generated by said host controller;
compare each received address to the addresses stored in said address match table; and
control said multiplexers such that one or more bits of a data word are written to and read from said redundant RAM chips when the address associated with said data word matches that of a faulty storage cell, such that the flow of data is directed around said faulty storage cell.

12. The memory module of claim 11, wherein each of said RAM chips containing a faulty storage cell has an associated address range, said address match table arranged such that addresses generated by said host controller that are determined to be within the address range of one of said RAM chips with a faulty storage cell cause said multiplexers to direct the flow of data around said faulty storage cell.

* * * * *